Figure 1:
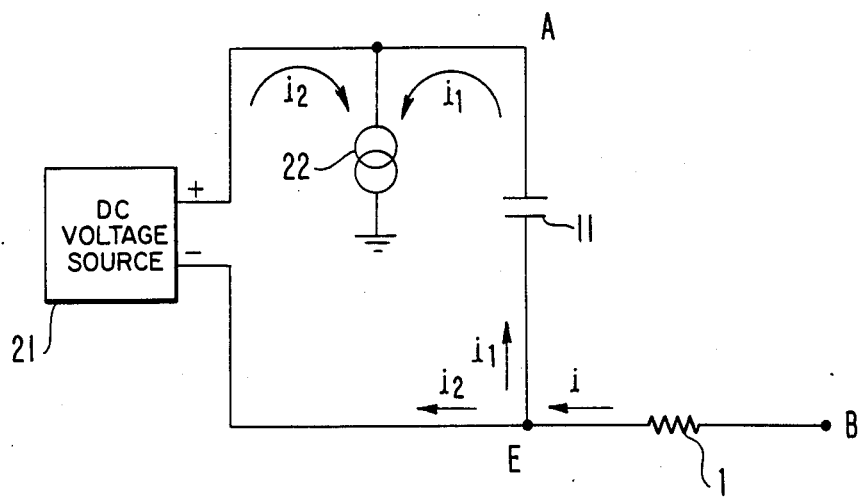

United States Patent [19]

Guillaumin

[11] Patent Number: 4,701,632
[45] Date of Patent: Oct. 20, 1987

[54] LOGIC CIRCUIT PRODUCING A DIRECT-CURRENT OUTPUT SIGNAL OF DETERMINED MAXIMUM INTENSITY

[75] Inventor: Jacquest Guillaumin, Les Lilas, France

[73] Assignee: Jeumont-Schneider Corporation, Puteaux cedex, France

[21] Appl. No.: 837,536

[22] Filed: Mar. 7, 1986

[30] Foreign Application Priority Data

Mar. 13, 1985 [FR] France ............................... 85 03645

[51] Int. Cl.$^4$ ............................................. H03K 5/08
[52] U.S. Cl. ................................... 307/261; 307/350; 307/555; 328/26
[58] Field of Search ................... 307/261, 270, 296 R, 307/555, 350, 475; 328/26

[56] References Cited

U.S. PATENT DOCUMENTS 4,507,571 3/1985 Callan .................................. 307/261

Primary Examiner—John Zazworsky
Attorney, Agent, or Firm—Rines and Rines, Shapiro and Shapiro

[57] ABSTRACT

A logic circuit produces a direct current signal not exceeding a predetermined maximum intensity at its output terminal regardless of the amplitude of an alternating current signal applied to its input terminal. The circuit includes an AC to DC converter having an output which is non-referenced to ground, a condenser connected between the positive and negative output terminals of the converter, and a constant current generator connected between the positive output terminal of the converter and ground, the negative output terminal of the converter constituting the output terminal of the logic circuit.

3 Claims, 2 Drawing Figures

LOGIC CIRCUIT PRODUCING A DIRECT-CURRENT OUTPUT SIGNAL OF DETERMINED MAXIMUM INTENSITY

The present invention concerns a logic circuit for producing a direct current signal limited to a predetermined maximum intensity, regardless of the amplitude of an alternating current signal at its input terminal.

Such a logic circuit finds application especially in the domain of railway signalling, and is placed by preference at the input of a threshold logic circuit, with intrinsic security, such as is described in the French Pat. No. 83.16331, filed 13 Oct. 1983 in the name of the present applicant, and enabling realization of logical functions by means of a number of circuits each having a "YES" function.

In the latter type of circuit, there is a minimum threshold for the amplitude of the input signal, below which this signal is considered not to exist. However, there also exists a maximum threshold for the input signal amplitude, which threshold is determined by the permanent saturation of an input transistor of the circuit. The window between the two thresholds is relatively narrow. This characteristic may be exploited to advantage in certain applications, but it can constitute a serious inconvenience in other applications.

The present invention thus has as its object to obviate this latter inconvenience. More particularly, it has as its object a logic circuit which operates such that a direct current signal appears at its output terminal, this current not exceeding a predetermined maximum intensity even if the amplitude of the input signal rises to a substantial value.

This maximum intensity is determined from knowledge of the input impedance of the threshold logic circuit, to which the subject circuit is to be connected, and from the characteristics of the thresholds of the signal window mentioned above.

In summary, the logic circuit of the invention comprises an AC to DC converter, the DC output of which is non-referenced to ground, a condenser connected between the positive output terminal and the negative output terminal of the converter, and a constant current generator connected between the positive output terminal and ground, with the negative output terminal constituting the output terminal of the logic circuit.

Preferably, the converter is constituted by a first and a second diode arranged in series, and the alternating current input signal is applied through the intermediary of a linking condenser to a junction between the anode of the first diode and the cathode of the second diode. The cathode of the first diode constitutes the positive output terminal of the converter, and the anode of the second diode is connected to ground through the intermediary of a decoupling condenser and constitutes the negative output terminal of the converter.

It is also preferred that the current generator be constituted by a transistor with its base connected to ground, its collector to the positive output terminal of the converter, and its emitter to a source of negative voltage through the intermediary of a resistance.

Figure 2:
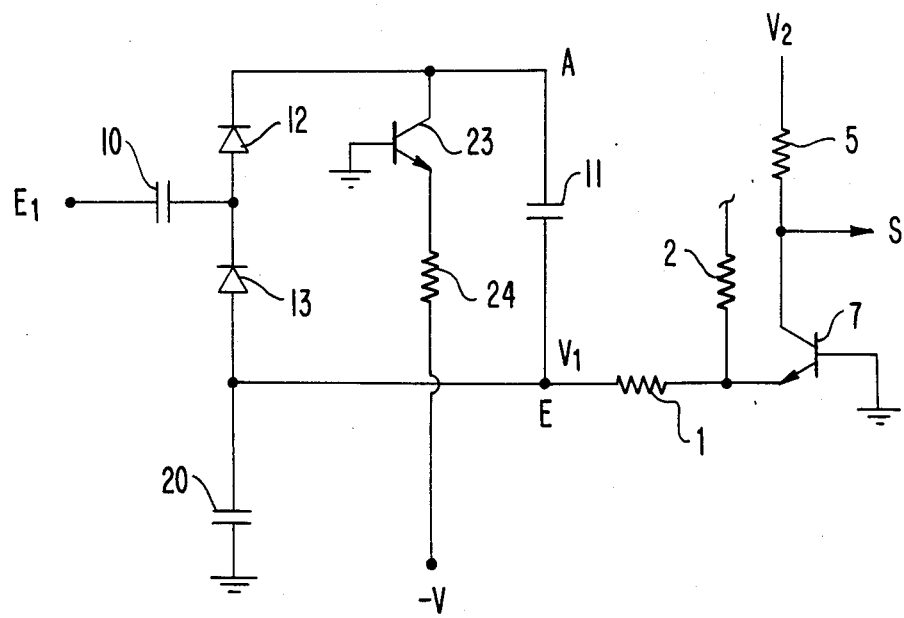

The invention will be better understood, and other goals, advantages and characteristics will become clearer, through a reading of the following description of one exemplary mode of embodiment with reference to the accompanying drawing figures, in which:

FIG. 1 represents the electrical schematic of the principal of a logical circuit conforming to the invention, and FIG. 2 represents the electrical schematic of a preferred mode of embodiment of the invention.

Referring to FIG. 1, it is observed that a direct current voltage source 21 charges a condenser 11 connected between the output terminals of the voltage source. A current generator 22 is connected between the positive terminal of voltage source 21 and ground. The negative terminal of the source 21 constitutes the output terminal of the circuit, which is connected to another logic circuit such as described in the French patent cited above, the input resistance 1 of which is indicated in FIG. 1. It is thus easily seen that whatever the potential difference between the output terminals of the voltage source, if the condenser 11 is charged, the current generator 22 imposes the intensity of current i circulating within the circuit, and consequently, limits the value of the voltage at the terminals of the input resistance 1 of the subsequent threshold logic circuit. Therefore, the logic circuit ensures that an appropriate voltage is applied at the point B, and for this reason, there is no theoretical upper limit to the charge of the condenser 11, that is, to the potential difference between the terminals of the direct current source 21. It will thus be appreciated that by using an AC to DC converter in place of the voltage source 21, a logic circuit will be obtained which operates such that the voltage at the terminals of the resistance 1 has a predetermined upper limit, independent of the amplitude of the alternating input signal applied to the converter.

FIG. 2 shows an exemplary embodiment of the invention designed in accordance with the principles of FIG. 1. In the illustrative embodiment, the AC to DC converter is constituted by a diode pump including two diodes 12 and 13 connected in series. An input terminal E1 of the circuit is connected to the diode pump, through a linking condenser 10, at the junction between the anode of diode 12 and the cathode of diode 13. The cathode of diode 12 and the anode of diode 13 respectively correspond to the positive and negative output terminals of the voltage source 21 in FIG. 1. Condenser 11 is connected between these outputs, as shown. A transistor 23 constitutes the current generator. Transistor 23 is mounted in common base configuration, with its base connected to ground, its emitter connected to a negative DC voltage source $-V$, and its collector connected to the positive output terminal of the diode pump. Transistor 23 presents a current gain substantially equal to unity, and its collector thus behaves as a current generator when the voltage at point A of the circuit is positive. A decoupling condenser 20 is connected between the negative terminal of the diode pump and ground in order to provide DC isolation between the direct current circuit and ground and to eliminate alternating current. By virtue of the DC isolation afforded by condenser 20, the direct current output at the terminals of the diode pump 12, 13 is non-referenced to ground. For this reason, the voltage at each terminal of condenser 11 with respect to ground can vary widely as a function of the amplitude of the alternating current signal applied to input terminal E1. Also, since the voltage converter (diode pump) and the condenser 11 are isolated from ground in respect of direct current by the condenser 20, direct current can flow into the illustrative circuit only from the input resistance 1 of the second logic circuit (only several components of which are shown in FIG. 2). See arrows i, i₁, and i₂ at point E in FIG. 1. The current in resistance 1 is determined entirely by the negative direct current voltage $-V$ applied to the emitter of transistor 23 through a resistance 24 and by the value of the resistance 24—or in other words, by the current intensity i imposed by the transistor.

Thus it is sufficient that the condenser 11 be charged to at least the minimum threshold of the second logic circuit for the output S of the second logic circuit to be active. However, there is no upper limit to the charge of the condenser 11, nor consequently to the value of the amplitude of the input signal.

There is thus realized a logic circuit presenting no upper threshold value, and capable of being connected to another logic circuit presenting an upper threshold. Such a circuit conforming to the present invention finds application also as a signal loss buffer. In effect, the condenser 11 serves as a reserve for the current drawn by the collector of the transistor 23 when the amplitude of the alternating current signal applied at the input terminal E1 diminishes. The condenser discharges at constant current, from its maximum charge voltage to the lower threshold voltage of the second logic circuit. This discharging requires a predetermined time interval which corresponds to the signal loss buffer interval. This circuit thus presents the additional advantage of buffering at constant current, i.e. under the best conditions of functioning of the associated circuit.

Although only a single mode of embodiment of the invention has been described, it is obvious that any modification brought about by those skilled in the art will not constitute a departure from the scope of the present invention as defined by the appended claims.

What is claimed is:

1. A logic circuit for producing a direct current signal not exceeding a predetermined maximum intensity at an output terminal of said circuit in response to an alternating current signal applied to an input terminal of said circuit, regardless of the amplitude of said alternating current signal, comprising an AC to DC converter having an alternating current input to which said alternating current signal is to be applied and a direct current output which is nonreferenced to ground, a condenser connected between a positive terminal of said output of said converter and a negative terminal of said output of said converter, and a constant current generator connected between said positive terminal and ground, said negative terminal constituting said output terminal of said logic circuit.

2. A logic circuit according to claim 1, wherein said AC to DC converter includes a first diode and a second diode connected in series, wherein said input terminal of said logic circuit is connected through a linking condenser to a point between an anode of said first diode and a cathode of said second diode, wherein a cathode of said first diode constitutes said positive terminal of said converter output, and wherein an anode of said second diode is connected to ground through a decoupling condenser and constitutes said negative terminal of said converter output.

3. A logic circuit according to claim 1, wherein said constant current generator includes a transistor having a base connected to ground, a collector connected to said positive terminal of said converter output, and an emitter connected through a resistance to a source of negative direct current voltage.

* * * * *